United States Patent
Moon et al.

(10) Patent No.: US 10,164,528 B2
(45) Date of Patent: Dec. 25, 2018

(54) SWITCH CONTROL CIRCUIT AND BUCK CONVERTER INCLUDING THE SAME

(71) Applicant: FAIRCHILD KOREA SEMICONDUCTOR LTD., Bucheon-si (KR)

(72) Inventors: SangCheol Moon, Daejeon (KR); Gwanbon Koo, Bucheon-si (KR); Chenghao Jin, Bucheon-si (KR); Bonggeun Chung, Incheon (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 85 days.

(21) Appl. No.: 15/196,678

(22) Filed: Jun. 29, 2016

(65) Prior Publication Data

US 2016/0380542 A1    Dec. 29, 2016

Related U.S. Application Data

(60) Provisional application No. 62/185,834, filed on Jun. 29, 2015.

(51) Int. Cl.

| | | |
|---|---|---|
| *H02M 1/08* | (2006.01) | |
| *H02M 3/158* | (2006.01) | |
| *H02M 3/156* | (2006.01) | |
| *H02M 7/04* | (2006.01) | |
| *G01R 19/04* | (2006.01) | |

(Continued)

(52) U.S. Cl.
CPC ............ *H02M 3/158* (2013.01); *G01R 19/04* (2013.01); *H02M 1/36* (2013.01); *H02M 1/44* (2013.01); *H02M 3/156* (2013.01); *H02M 7/04* (2013.01); *H02M 7/217* (2013.01); *H02M 2001/0009* (2013.01); *H02M 2001/0048* (2013.01); *H02M 2001/0054* (2013.01); *H02M 2001/0058* (2013.01); *Y02B 70/1491* (2013.01)

(58) Field of Classification Search
CPC .............. Y02B 70/14; Y02B 70/1425; Y02B 70/1458; Y02B 70/1466; Y02B 70/1491; G01R 19/04; H02M 1/083; H02M 1/36; H02M 1/38; H02M 1/44; H02M 7/04; H02M 7/217; H02M 7/219; H02M 3/156; H02M 3/158; H02M 2001/0003; H02M 2001/0009; H02M 2001/0048; H02M 2001/0058
See application file for complete search history.

(56) References Cited

U.S. PATENT DOCUMENTS 6,650,550 B2    11/2003    Wittenbreder, Jr.
7,218,085 B2    5/2007    Abedinpour et al.
(Continued)

*Primary Examiner* — Timothy J Dole
*Assistant Examiner* — Ivan Laboy Andino
(74) *Attorney, Agent, or Firm* — AMPACC Law Group, PLLC

(57) ABSTRACT

A buck converter includes a power switch having one end to which an input voltage is transferred, a synchronous switch connected between the other end of the power switch and the ground, an inductor having an end connected to the other end of the power switch, and a switch control circuit configured to calculate a zero voltage delay time based on at least an ON time of the power switch and a delay time. The delay time is determined based on the inductor and parasitic capacitors of the power switch and the synchronous switch.

7 Claims, 9 Drawing Sheets

(51) Int. Cl.
*H02M 1/36* (2007.01)
*H02M 1/44* (2007.01)
H02M 1/00 (2006.01)
H02M 7/217 (2006.01)

(56) References Cited

U.S. PATENT DOCUMENTS

| | | | |
|---|---|---|---|
| 2005/0265058 A1* | 12/2005 | Stevanovic | H02M 3/156 |
| | | | 363/131 |
| 2007/0013349 A1 | 1/2007 | Bassett | |
| 2014/0085949 A1* | 3/2014 | Sugawara | H02M 1/4225 |
| | | | 363/89 |
| 2014/0300329 A1* | 10/2014 | Thompson | H03K 5/1536 |
| | | | 323/235 |
| 2016/0233771 A1* | 8/2016 | Chen | H02M 3/158 |
| 2016/0276945 A1* | 9/2016 | Yan | H02M 3/33592 |
| 2016/0308441 A1* | 10/2016 | Chen | H02M 3/158 |

* cited by examiner

SWITCH CONTROL CIRCUIT AND BUCK CONVERTER INCLUDING THE SAME

CROSS-REFERENCE TO RELATED APPLICATIONS

This application claims priority from U.S. Provisional Application No. 62/185,834, filed on Jun. 29, 2015 with the United States Patent and Trademark Office, the entire contents of which are incorporated herein by reference.

BACKGROUND (a) Technical Field

Embodiments relate to a switch control circuit for zero voltage switching and a buck converter including the same.

(b) Description of the Related Art

A buck converter includes a power switch that receives an input voltage and performs switching and an inductor and a capacitor that are connected to the power switch. A diode may be connected between the inductor and the ground to decrease a flowing inductor current while the power switch is turned off. The buck converter may include a metal-oxide semiconductor field-effect transistor (MOSFET) instead of a diode. The switching of MOSFET may be controlled in synchronization with the switching of the power switch.

The buck converter may operate according to a threshold operation mode in which an inductor current reaches zero. In this case, in order to perform zero voltage switching (ZVS), the buck converter further includes a separate ZVS circuit.

SUMMARY

The present invention is directed to providing a switch control circuit that may achieve zero voltage switching (ZVS) without a separate ZVS circuit and a buck converter including the same.

According to an aspect of the present invention, there is provided a switch control circuit for a power switch and a synchronous switch that are connected to an inductor. The switch control circuit includes a comparator configured to compare a detection voltage obtained by detecting an inductor current flowing through the inductor with a predetermined reference voltage, a delay unit configured to delay an output of the comparator by a zero voltage delay time, and a zero voltage delay calculation unit configured to calculate the zero voltage delay time based on at least an ON time of the power switch and a delay time. The delay time is determined based on the inductor and parasitic capacitors of the power switch and the synchronous switch.

The zero voltage delay calculation unit may calculate the zero voltage delay time based on the ON time and an OFF time of the power switch and the delay time.

The zero voltage delay calculation unit may calculate the zero voltage delay time based on a result of adding the ON time and the OFF time of the power switch, dividing the sum by the ON time, and multiplying the quotient by the delay time.

The zero voltage delay calculation unit may calculate a difference between a first zero voltage delay time calculated for a first previous switching period of the power switch and a second zero voltage delay time calculated for a second previous switching period of the power switch and may compensate for a zero voltage delay time of a current switching period of the power switch using the calculated difference.

The zero voltage delay calculation unit may calculate the zero voltage delay time by adding the ON time and the OFF time in a current switching period of the power switch, dividing the sum by the ON time in the current switching period, multiplying the quotient by the delay time, and adding the calculated difference to the product.

The switch control circuit may control a peak current of the inductor current to be constant. The zero voltage delay calculation unit may calculate the zero voltage delay time based on a comparison voltage corresponding to an output voltage generated by the inductor current, a delay time, and the ON time of the power switch.

The zero voltage delay calculation unit may calculate the zero voltage delay time based on the delay time and a result of multiplying the comparison voltage and the delay time and dividing the product by the ON time of the power switch.

The zero voltage delay calculation unit may calculate the zero voltage delay time by multiplying a predetermined proportional constant, the comparison voltage, and the delay time, dividing the product by the ON time of the power switch, and adding the delay time to the quotient.

A product of the comparison voltage and the proportional constant may be based on a result of dividing a product resulting from multiplying the peak current of the inductor current and an inductance of the inductor by the output voltage.

The comparison voltage may include information regarding the peak current of the inductor current, and information regarding the proportional constant may set by a node voltage between two resistors connected through a compensation pin of the switch control circuit.

The switch control circuit may control the ON time of the power switch to be constant. The zero voltage delay calculation unit may calculate the zero voltage delay time based on the ON time of the power switch, the delay time, and a detection voltage peak, and the detection voltage peak may be a peak of the detection voltage for each switching period of the power switch.

The zero voltage delay calculation unit may calculate the zero voltage delay time by multiplying a predetermined proportional constant, the detection voltage peak, and the delay time, dividing the product by the ON time, and adding the delay time to the quotient.

The zero voltage delay calculation unit may calculate the zero voltage delay time by multiplying a predetermined proportional constant, the detection voltage peak, and the delay time, dividing the product by a comparison voltage, and adding the delay time to the quotient, and the comparison voltage may correspond to an output voltage generated by the inductor current.

A product of the detection voltage peak and the proportional constant may be based on a result of dividing a product of a peak current of the inductor current and an inductance of the inductor by the output voltage.

The detection voltage peak may include information regarding a peak current of the inductor current, and the information regarding the proportional constant may be set by a node voltage between two resistors connected through a compensation pin of the switch control circuit.

According to another aspect of the present invention, there is provided a buck converter including a power switch having one end to receive an input voltage, a synchronous switch connected between a second end of the power switch and the ground, an inductor having an end connected to the second end of the power switch, and a switch control circuit configured to calculate a zero voltage delay time based on at least an ON time of the power switch and a delay time. The delay time is determined based on the inductor and parasitic capacitors of the power switch and the synchronous switch.

The switch control circuit may calculate the zero voltage delay time based on the ON time and an OFF time of the power switch and the delay time.

The switch control circuit may calculate a difference between a first zero voltage delay time calculated for a first previous switching period of the power switch and a second zero voltage delay time calculated for a second previous switching period of the power switch and may compensate for a zero voltage delay time of a current switching period of the power switch using the calculated difference.

The switch control circuit may control a peak current of the inductor current to be constant and may calculate the zero voltage delay time based on a comparison voltage corresponding to an output voltage of the buck converter, the delay time, and the ON time of the power switch.

The switch control circuit may control the ON time of the power switch to be constant and may calculate the zero voltage delay time based on the ON time of the power switch, the delay time, and a value corresponding to a peak current of the inductor current.

The present invention provides a switch control circuit that can achieve zero voltage switching (ZVS) without a separate ZVS circuit and a buck converter including the same.

DETAILED DESCRIPTION OF THE EMBODIMENTS

Figure 1:
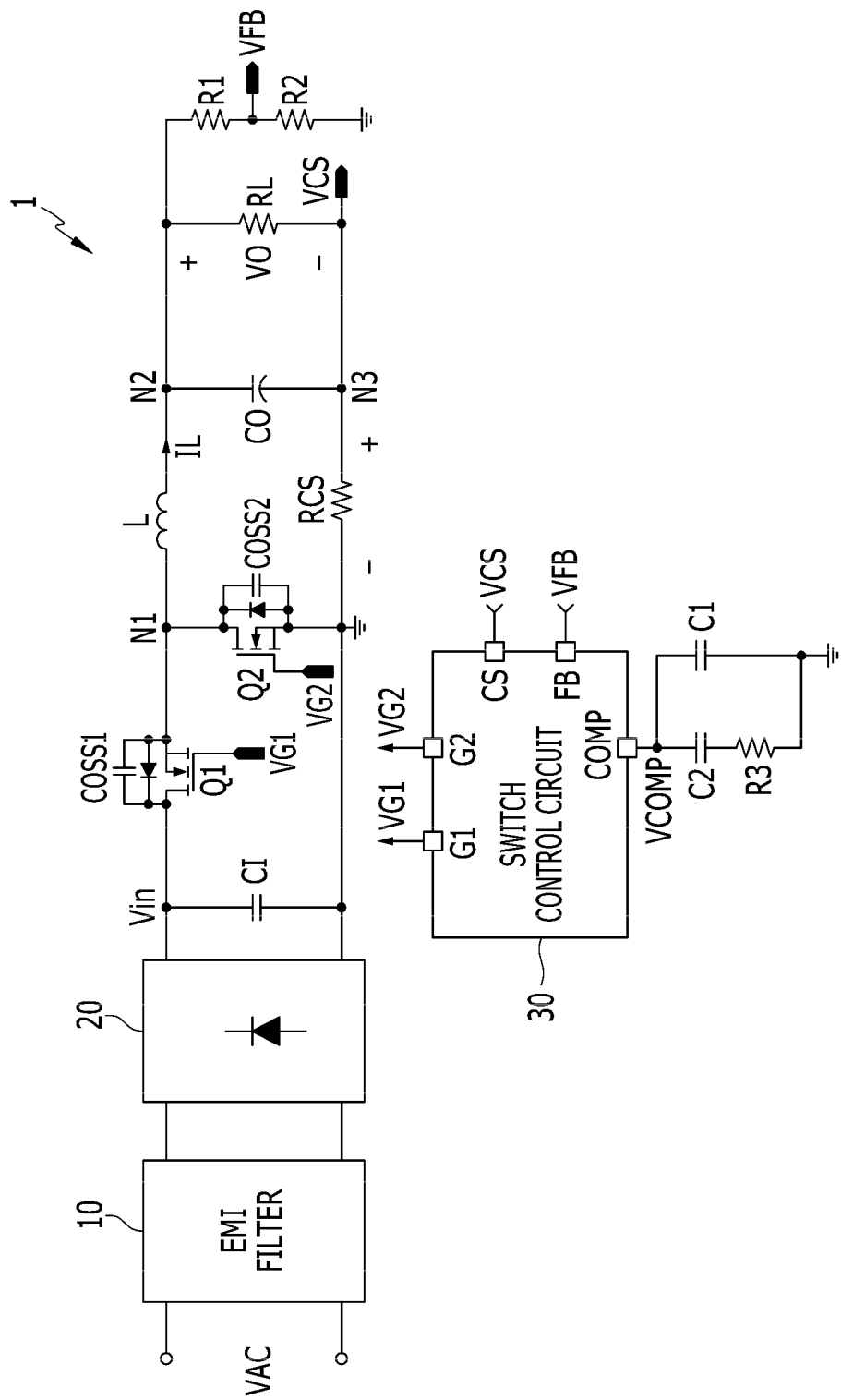
FIG. 1 is a diagram showing a buck converter according to an embodiment.

Hereinafter, exemplary embodiments will be described in detail with reference to the accompanying drawings so that they can be easily practiced by those skilled in the art to which the present invention pertains. The present invention may, however, be embodied in many different forms and should not be construed as being limited to the embodiments set forth herein. In the accompanying drawings, portions irrelevant to a description of the exemplary embodiments will be omitted for clarity. Moreover, like reference numerals refer to like elements throughout.

In this disclosure, when one part (or element, device, etc.) is referred to as being "connected" to another part (or element, device, etc.), it should be understood that the former can be "directly connected" to the latter, or "electrically connected" to the latter via an intervening part (or element, device, etc.). Furthermore, when one part is referred to as "comprising (or including or having)" other elements, it should be understood that it can comprise (or include or have) only those elements, or other elements as well as those elements unless specifically described otherwise.

Hereinafter, embodiments in which zero voltage switching (ZVS) is provided by controlling a switch operation without a separate ZVS circuit will be described with reference to the accompanying drawings.

FIG. 1 is a diagram showing a buck converter according to an embodiment.

As shown in FIG. 1, a buck converter 1 includes an electromagnetic interference (EMI) filter 10, a rectifier circuit 20, a power switch Q1, a synchronous switch Q2, and a switch control circuit 30.

The EMI filter 10 removes noise of an alternating-current input VAC, and the alternating-current input VAC is rectified to a line input voltage Vin through the rectifier circuit 20. Hereinafter, the line input voltage Vin is referred to as an input voltage.

A noise component of the input voltage Vin may be filtered out through a capacitor CI connected to the both ends of the rectifier circuit 20.

The input voltage Vin is input to a drain of the power switch Q1. A source of the power switch Q1 is connected to a node N1. A drain of the synchronous switch Q2 is connected to the node N1. A source of the synchronous switch Q2 is connected to the ground.

The power switch Q1 and the synchronous switch Q2 are each implemented as an n-type metal-oxide semiconductor field-effect transistor (MOSFET). A gate voltage VG1 and a gate voltage VG2 are input to a gate of the power switch Q1 and a gate of the synchronous switch Q2, respectively. The power switch Q1 and the synchronous switch Q2 are turned on when the gate voltage VG1 and the gate voltage VG2 are at a high level. The power switch Q1 and the synchronous switch Q2 are turned off when the gate voltage VG1 and the gate voltage VG2 are at a low level.

An inductor L is connected between the node N1 and a node N2. A capacitor CO is connected between the node N2 and a node N3. A resistor RCS is connected between the node N3 and the ground. An output voltage VO is a voltage across the capacitor CO and is supplied to a load RL.

The resistor RCS is a resistor for detecting an inductor current IL flowing through the inductor L. A voltage of the node N3 is a voltage that is determined according to the inductor current IL and the resistor RCS, and is hereinafter referred to as a detection voltage VCS. A resistor R1 and a resistor R2 are connected in series between the node N2 and the ground. The output voltage VO is divided by the resistor R1 and the resistor R2 to become a feedback voltage VFB.

During an ON time of the power switch Q1, the inductor current IL flowing through the inductor L also flows to the ground through the capacitor CO and the resistor RCS. When a predetermined dead time passes from a time at which the power switch Q1 is turned off, the synchronous switch Q2 is turned on. During an ON time of the synchronous switch Q2, the inductor current IL decreases while flowing through the synchronous switch Q2, the inductor L, the capacitor CO, and the resistor RCS.

When a delay for zero voltage switching (i.e., a zero voltage delay time) passes from a time at which the inductor current IL becomes a zero current, the synchronous switch Q2 is turned off. Then, when a predetermined dead time passes, the power switch Q1 is turned on. In this case, the dead time may be set so that the power switch Q1 may be turned on when the inductor current IL flows in a negative direction (i.e., a direction opposite to the arrow direction of the inductor current shown in FIG. 1).

The switch control circuit 30 may include an element for calculating a zero voltage delay time (hereinafter referred to as a zero voltage delay calculation unit). The zero voltage delay calculation unit may calculate a zero voltage delay time at which a voltage across the power switch Q1 becomes zero voltage because a parasitic capacitor COSS1 is discharged due to a negative inductor current IL.

The switch control circuit 30 delays a turn-off time of the synchronous switch Q2 by the calculated zero voltage delay time. As the turn-off time of the synchronous switch Q2 is delayed, a turn-on time of the power switch Q1 is also delayed. Then, the parasitic capacitor COSS1 is discharged due to a negative inductor current IL. Thus, the voltage across the power switch Q1 may reach zero voltage. In this case, a parasitic capacitor COSS2 is charged due to the negative inductor current IL.

The feedback voltage VFB and the detection voltage VCS are input through a feedback pin FB and a detection pin CS of the switch control circuit 30, respectively. The gate voltage VG1 and the gate voltage VG2 are output through gate pins G1 and G2. A capacitor C1 is connected between a compensation pin COMP of the switch control circuit 30 and the ground. A capacitor C2 and a resistor R3 are connected in series between the compensation pin COMP and the ground.

The switch control circuit 30 generates the gate voltages VG1 and VG2 that control switching operations of the power switch Q1 and the synchronous switch Q2 using the feedback voltage VFB, a comparison voltage VCOMP corresponding to the feedback voltage VFB, and the detection voltage VCS.

Figure 2:
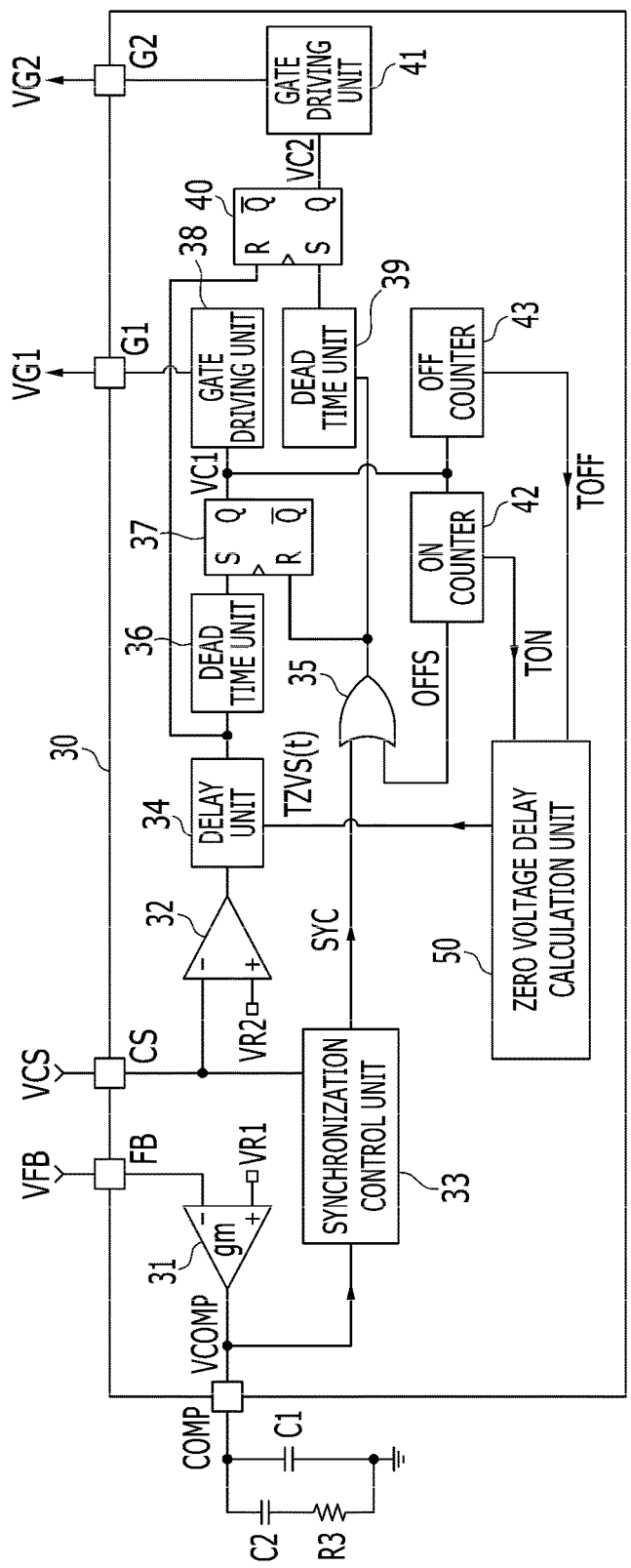
FIG. 2 is a diagram showing a switch control circuit according to an embodiment.

FIG. 2 is a diagram showing a switch control circuit according to an embodiment.

As shown in FIG. 2, the switch control circuit 30 includes an operational amplifier 31, a comparator 32, a synchronization control unit 33, a delay unit 34, a logical gate 35, two dead time units 36 and 39, two SR flip-flops 37 and 40, two gate driving unit 38 and 41, an ON counter 42, an OFF counter 43, and a zero voltage delay calculation unit 50.

The operational amplifier 31 amplifies and outputs a difference between a reference voltage VR1 and the feedback voltage VFB. The comparison voltage VCOMP is generated by the capacitors C1 and C2 and the resistor R3 by performing frequency gain compensation on an output of the operational amplifier 31.

The synchronization control unit 33 outputs a synchronization signal SYC for controlling switching according to any one of peak current mode control and voltage mode control. According to the synchronization signal SYC, the power switch Q1 may be turned off, and the synchronous switch Q2 may be turned on.

The synchronization control unit 33 may generate the synchronization signal SYC on the basis of a result of comparison between the comparison voltage VCOMP and the detection voltage VCS according to the peak current mode control. Alternatively, the synchronization control unit 33 may generate the synchronization signal SYC on the basis of a result of comparison between the comparison voltage VCOMP and a predetermined signal synchronized with a switching frequency according to the voltage mode control. In this case, the predetermined signal synchronized with the switching frequency may have a saw-tooth waveform that increases during one switching period of the power switch Q1 from the turn-on time of the power switch Q1.

The comparator 32 outputs a result obtained by comparing the detection voltage VCS and a reference voltage VR2. The detection voltage VCS is input to an inverting terminal (−) of the comparator 32. The reference voltage VR2 is input to a non-inverting terminal (+) of the comparator 32. The comparator 32 outputs a high level when the input of the non-inverting terminal (+) is equal to or greater than the input of the inverting terminal (−). Otherwise, the comparator 32 outputs a low level.

The delay unit 34 delays an output of the comparator 32 by a time corresponding to a delay control signal TZVS transferred from the zero voltage delay calculation unit 50.

The dead time unit 36 delays an output of the delay unit 34 by a dead time.

The SR flip-flop 37 raises a gate control signal VC1 to a high level according to an input of a set terminal S and lowers the gate control signal VC1 to a low level according to an input of a reset terminal R. An output of the dead time unit 36 is input to the set terminal S of the SR flip-flop 37. An output of the logical gate 35 is input to the reset terminal R of the SR flip-flop 37. An output terminal Q of the SR flip-flop 37 is connected to the ON counter 42, the OFF counter 43, and the gate driving unit 38.

The gate driving unit 38 generates the gate voltage VG1 according to the gate control signal VC1. For example, the gate driving unit 38 generates a high-level gate voltage VG1 according to a high-level gate control signal VC1 and generates a low-level gate voltage VG1 according to a low-level gate control signal VC1.

The ON counter 42 counts an ON time of the power switch Q1 using the gate control signal VC1 and generates an ON count signal TON based on a result of the counting. In addition, when the counting result is reached during a predetermined maximum ON time, the ON counter 42 may generate an OFF signal OFFS for turning off the power switch Q1. For example, the ON counter 42 generates a high-level OFF signal OFFS. The OFF signal OFFS is transferred to the logical gate 35.

The OFF counter 43 counts an OFF time of the power switch Q1 using the gate control signal VC1 and generates an OFF count signal TOFF based on a result of the counting.

The logical gate 35 determines an output by performing a logical disjunction operation between the synchronization signal SYC and the OFF signal OFFS. When at least one of the synchronization signal SYC and the OFF signal OFFS is at a high level, the logical gate 35 outputs a high level.

The dead time unit 39 delays the output of the logical gate 35 by a dead time.

The SR flip-flop 40 raises a gate control signal VC2 to a high level according to an input of a set terminal S and lowers the gate control signal VC2 to a low level according to an input of a reset terminal R. An output of the dead time unit 39 is input to the set terminal S of the SR flip-flop 40. An output of the delay unit 34 is input to the reset terminal R of the SR flip-flop 40. An output terminal Q of the SR flip-flop 40 is connected to the gate driving unit 41.

The gate driving unit 41 generates the gate voltage VG2 according to the gate control signal VC2. For example, the gate driving unit 41 generates a high-level gate voltage VG2 according to a high-level gate control signal VC2 and generates a low-level gate voltage VG2 according to a low-level gate control signal VC2.

The zero voltage delay calculation unit 50 calculates a zero voltage delay time TZVS(t) using an ON time, an OFF time of the power switch Q1 and a delay time. The delay time may correspond to a resonance period that is determined by the inductor L and the parasitic capacitors COSS1 and COSS2. For example, the zero voltage delay calculation unit 50 may calculate the zero voltage delay time TZVS(t) by summing an ON time Ton(t) based on the ON count signal TON and an OFF time Toff(t) based on the OFF count signal TOFF, dividing the sum by the ON time Ton(t), and multiplying the quotient by the delay time.

The zero voltage delay calculation unit 50 will be described in detail with reference to waveform charts of FIGS. 3 and 4.

Figure 3:
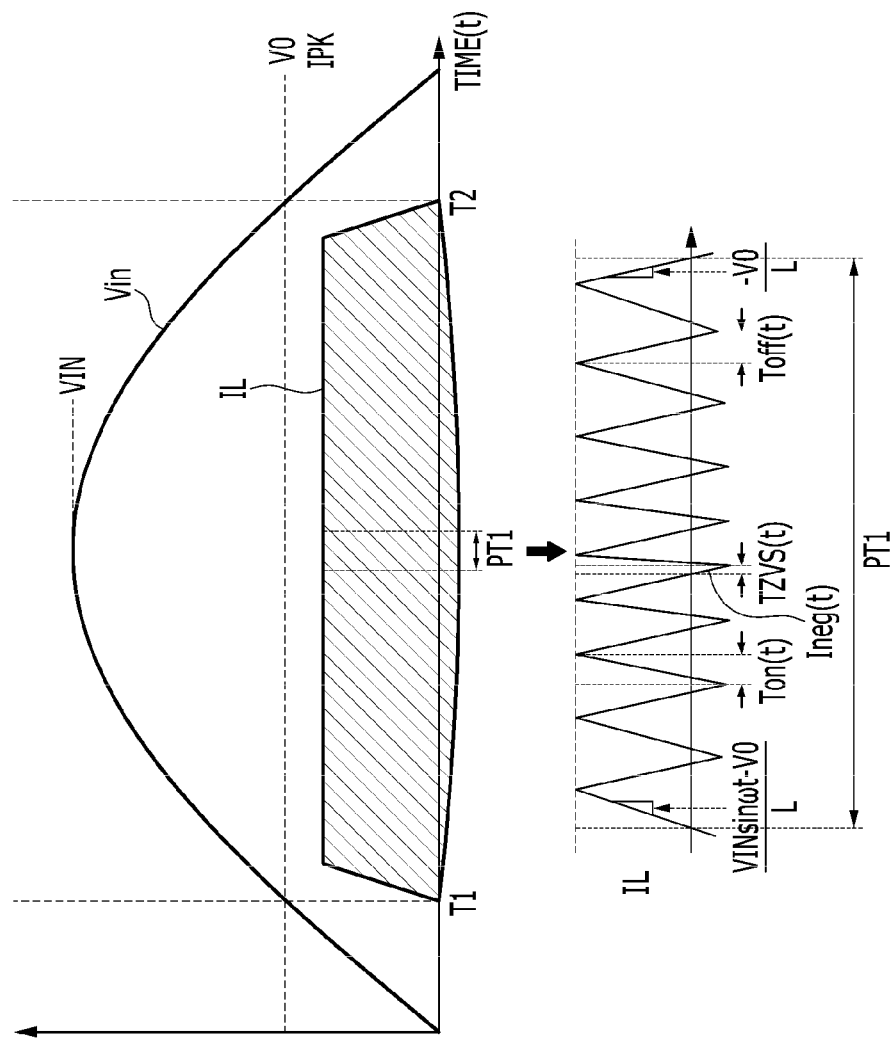
FIG. 3 is a waveform chart showing an inductor current, an inductor current peak, an input voltage, and an output voltage according to peak current mode control.

FIG. 3 is a waveform chart showing an inductor current, a peak of the inductor current, an input voltage, and an output voltage according to the control of a peak current mode.

Figure 4:
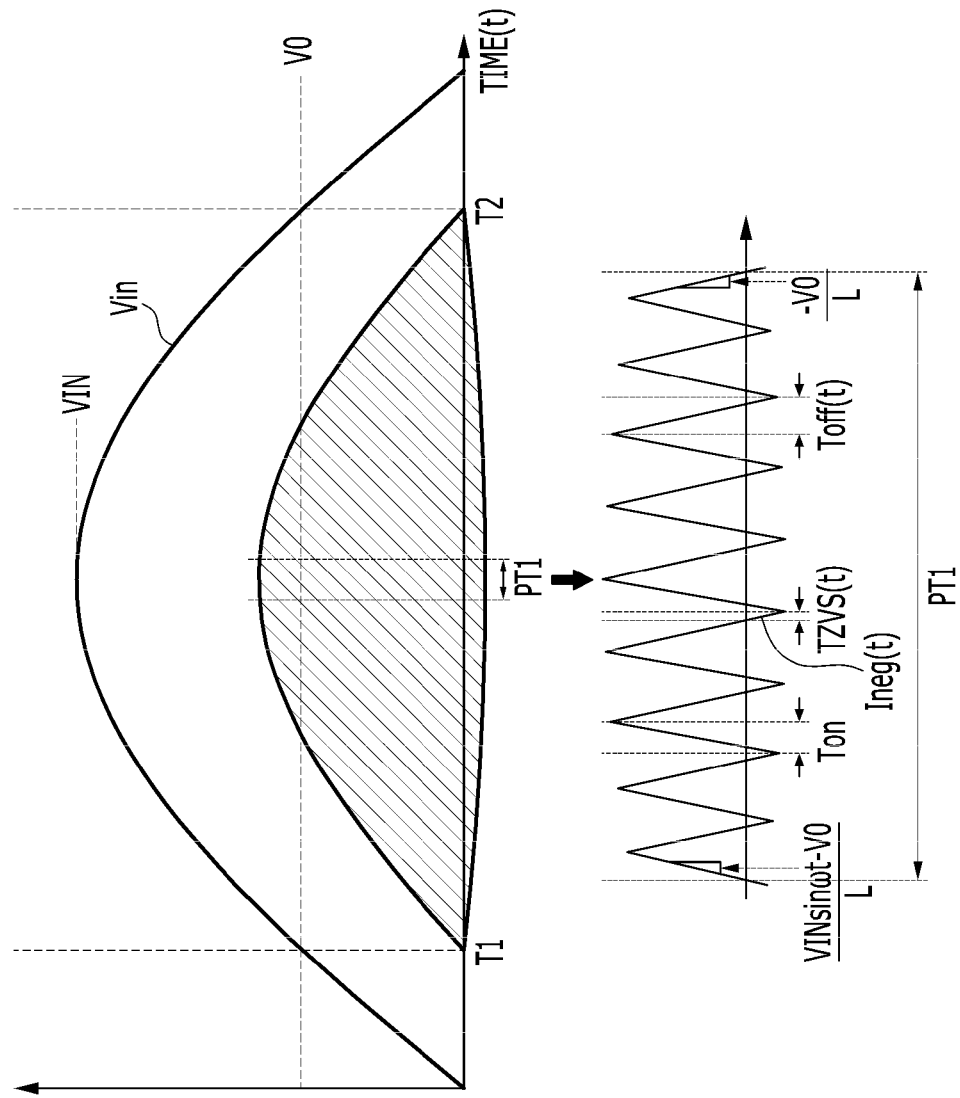
FIG. 4 is a waveform chart showing an inductor current, an inductor current peak, an input voltage, and an output voltage according to voltage mode control.

FIG. 4 is a waveform chart showing an inductor current, an inductor current peak, an input voltage, and an output voltage according to voltage mode control.

Like reference numerals in the drawings denote like elements in order to avoid repetitive description.

The buck converter 1 regulates an output voltage VO to maintain the output voltage VO at a certain level. The power switch Q1 and the synchronous switch Q2 do not perform switching during a time between T1 and T2 in which the output voltage VO is higher than an input voltage Vin.

In the peak current mode control shown in FIG. 3, a peak of the inductor current IL is controlled to a predetermined peak IPK. In the voltage mode control shown in FIG. 4, the ON time of the power switch Q1 is fixed during one period of the input voltage Vin. Thus, the peak of the inductor current IL changes with the input voltage Vin.

In one switching period, the inductor current IL increases during the ON time of the power switch Q1 and decreases during the ON time of the synchronous switch Q2. Because the switching period is very short, the inductor current IL during one period of the input voltage Vin is shown as oblique-striped regions in FIGS. 3 and 4.

For convenience of description, waveforms of the inductor current IL during time period PT1 of FIGS. 3 and 4 are exaggerated.

The input voltage Vin has a sinusoidal form and thus may be expressed as VIN*sin ωt. Here, VIN is a peak in one period of the input voltage Vin, w is a frequency of the input voltage Vin, and t is a time.

During the ON time of the power switch Q1, the inductor current IL increases with the slope of (VIN*sin ωt−VO)/L. L is an inductance of the inductor L. While the power switch Q1 is turned off, and the synchronous switch Q2 is turned on, the inductor current IL decreases with the slope of VO/L. In FIGS. 3 and 4, the slope of decrease is shown as −VO/L.

The inductor current IL flows in a negative direction during the zero voltage delay time TZVS(t). The inductor current IL during the zero voltage delay time TZVS(t) may be expressed as Ineg(t). The zero voltage delay time is expressed as TZVS(t) because the zero voltage delay time may change with time.

Due to a negative inductor current Ineg(t) during the zero voltage delay time TZVS(t), the parasitic capacitor COSS1 of the power switch Q1 is discharged, and the parasitic capacitor COSS2 of the synchronous switch Q2 is charged.

For ZVS, the zero voltage delay time TZVS(t) should be calculated such that energy caused by the negative inductor current Ineg(t) is equal to the sum of energy discharged from the parasitic capacitor COSS1 and energy charged by the parasitic capacitor COSS2. When the zero voltage delay time TZVS(t) is shorter than a required time, the ZVS cannot be accomplished. When the zero voltage delay time TZVS(t) is longer than the required time, conduction loss may occur.

On the assumption that the peak current IPK is much higher than the negative inductor current Ineg(t), a relationship between the energy L·Ineg(t)²/2 supplied by the negative inductor current IL and the discharged energy COSS1·VDS1(t)²/2 of the parasitic capacitor COSS1 and the charged energy COSS2·VDS2(t)²/2 of the parasitic capacitor COSS2 may be expressed as Equation 1 below. COSS1 and COSS2 are capacitances of the capacitors.

$$L \cdot Ineg(t)^2 = COSS1 \cdot VDS1(t)^2 + COSS2 \cdot VDS2(t)^2, \quad \text{[Equation 1]}$$

where VDS1(t) is a voltage of the parasitic capacitor COSS1 during the zero voltage delay time TZVS(t), and VDS2(t) is a voltage of the parasitic capacitor COSS2. During the zero voltage delay time TZVS(t), the parasitic capacitor COSS1 is discharged from the input voltage Vin to zero voltage, and the parasitic capacitor COSS2 is charged from zero voltage to the input voltage Vin. Thus, VDS1(t)² and VDS2(t)² may be expressed as the square of the input voltage Vin, that is, (VIN*sin ωt)². Then, the right side of Equation 1 may be expressed as C*(VIN*sin ωt)², and C is the sum of COSS1 and COSS2.

During the zero voltage delay time TZVS(t), Ineg(t) may be expressed as (VO/L)*TZVS(t). The following Equation 2 is obtained by applying this to Equation 1 and performing rearrangement.

$$\frac{VO^2}{L} \cdot TZVS(t)^2 = C \cdot (VIN \sin \omega t)^2. \quad \text{[Equation 2]}$$

A duty ratio $$\frac{Ton(t)}{Ton(t) + Toff(t)}$$

that is obtained by dividing the ON time of the power switch Q1 by a switching period is based on a ratio VO/Vin of the output voltage VO to the input voltage Vin (VO/Vin). Ton(t) is an ON time in one switching period of the power switch Q1, and Toff(t) is an OFF time in one switching period of the power switch Q1. The ON time and the OFF time of the power switch Q1 may change with time, and thus are expressed as Ton(t) and Toff(t), respectively. Then, the input voltage Vin, that is, VIN*sin ωt may be expressed as $$\frac{Ton(t) + Toff(t)}{Ton(t)} VO.$$

The following Equation 3 is obtained by substituting this to Equation 2 and performing rearrangement with respect to the zero voltage delay time TZVS(t).

$$TZVS(t) = \sqrt{LC} \cdot \frac{Ton(t) + Toff(t)}{Ton(t)}, \quad \text{[Equation 3]}$$

where $\sqrt{LC}$ is a constant value corresponding to a resonance period determined by the inductor and the parasitic capacitors COSS1 and COSS2. Here, $\sqrt{LC}$ is a predetermined delay time and is expressed as Td.

Since the delay time Td is a constant value, the zero voltage delay time TZVS(t) is determined according to $$\frac{Ton(t) + Toff(t)}{Ton(t)}$$

of the power switch Q1. The zero voltage delay calculation unit 50 according to an embodiment may receive the ON count signal TON and the OFF count signal TOFF based on Equation 3, calculate $$\frac{Ton(t) + Toff(t)}{Ton(t)},$$

and multiply the calculated value by the predetermined delay time Td to calculate the zero voltage delay time TZVS(t).

According to an embodiment, the ON count signal TON and the OFF count signal TOFF may be digital signals indicating the ON time Ton(t) and OFF time Toff(t), respectively. An LC value and the zero voltage delay time TZVS(t) may be digital signals. Furthermore, the zero voltage delay calculation unit 50 may include a digital circuit for processing the digital signals. The delay unit 34 may also include a digital circuit to apply the zero voltage delay time TZVS(t) to the output of the comparator 32.

Figure 5:
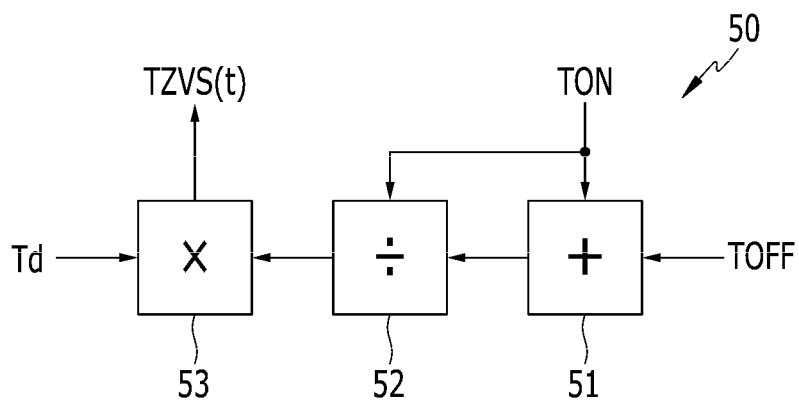
FIG. 5 is a diagram showing a zero voltage delay calculation unit according to an embodiment.

FIG. 5 is a diagram showing a zero voltage delay calculation unit according to an embodiment.

As shown in FIG. 5, the zero voltage delay calculation unit 50 includes an adder 51, a divider 52, and a multiplier 53.

The adder 51 calculates Ton(t)+Toff(t) based on the ON count signal TON and the OFF count signal TOFF.

The divider 52 divides Ton(t)+Toff(t), which is an output of the adder 51, by Ton(t), which is a value based on the ON count signal TON.

The multiplier 53 multiplies $$\frac{Ton(t) + Toff(t)}{Ton(t)},$$

which is an output of the divider 52, by the delay time Td to calculate the zero voltage delay time TZVS(t).

According to an embodiment, the OFF time Toff(t) of the power switch Q1 may be an OFF time in the immediately previous period rather than an OFF time in a current switching period. This is because the zero voltage delay time TZVS(t) cannot be calculated within a desired time because of a delay that has occurred in counting the OFF time Toff(t) of the power switch Q1 in the current period and generating an OFF count signal TOFF according to a result of the counting. When the zero voltage delay time TZVS(t) is calculated using the OFF time in the immediately previous period, a difference between the OFF time in the immediately previous switching period and the OFF time in the current switching period may make it difficult to perform zero voltage switching.

In order to supplement this, a zero voltage delay calculation unit according to another embodiment calculates a difference between a zero voltage delay time calculated for the first previous switching period and a zero voltage delay time calculated for the second previous switching period. The zero voltage delay calculation unit may compensate for a zero voltage delay time in the current switching period by using the calculated difference.

Figure 6:
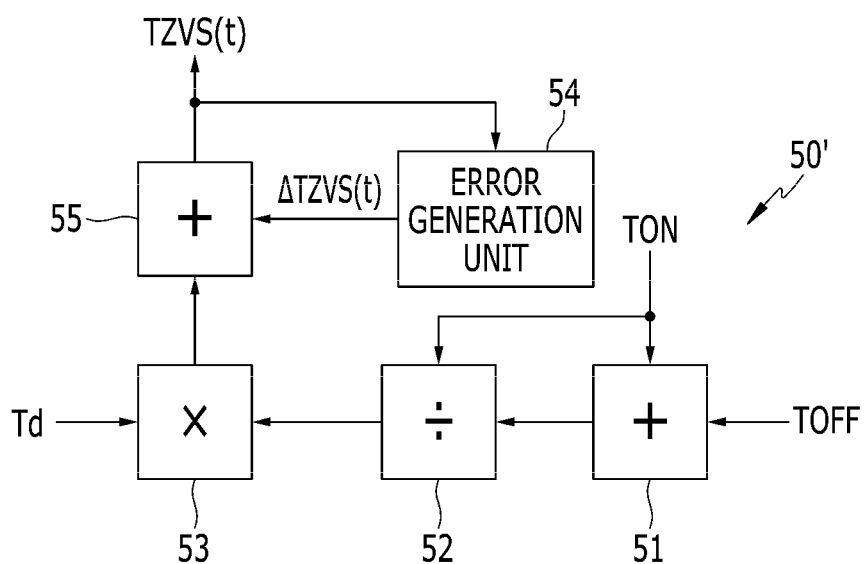
FIG. 6 is a diagram showing a zero voltage delay calculation unit according to another embodiment.

FIG. 6 is a diagram showing a zero voltage delay calculation unit according to another embodiment.

A zero voltage delay calculation unit 50' of FIG. 6 may further include an error generation unit 54 and an adder 55, compared to the zero voltage delay calculation unit 50 shown in FIG. 5. The same reference numerals are used for the same elements as those in the above-described embodiment, and descriptions thereof will be omitted.

The error generation unit 54 generates a compensation time ΔTZVS(t) that is based on a difference between the zero voltage delay time calculated for the second previous period (e.g., an (n−2)th switching period) and the zero voltage delay time calculated for the first previous period (e.g., an (n−1)th switching period) with respect to the current switching period (e.g., an nth switching period).

The adder 55 adds the compensation time ΔTZVS(t) to an output of the multiplier 53 to calculate the zero voltage delay time TZVS(t).

In the peak current mode control, the comparison voltage VCOMP may indicate information regarding the peak current IPK of the inductor current IL. This is because, when the detection voltage VCS reaches the comparison voltage VCOMP, the power switch Q1 may be turned off to control the peak current IPK according to the comparison voltage VCOMP.

In the peak current mode control, the zero voltage delay calculation unit according to still another embodiment calculates the zero voltage delay time TZVS(t) using a relationship between the comparison voltage VCOMP and the peak current IPK.

Figure 7:
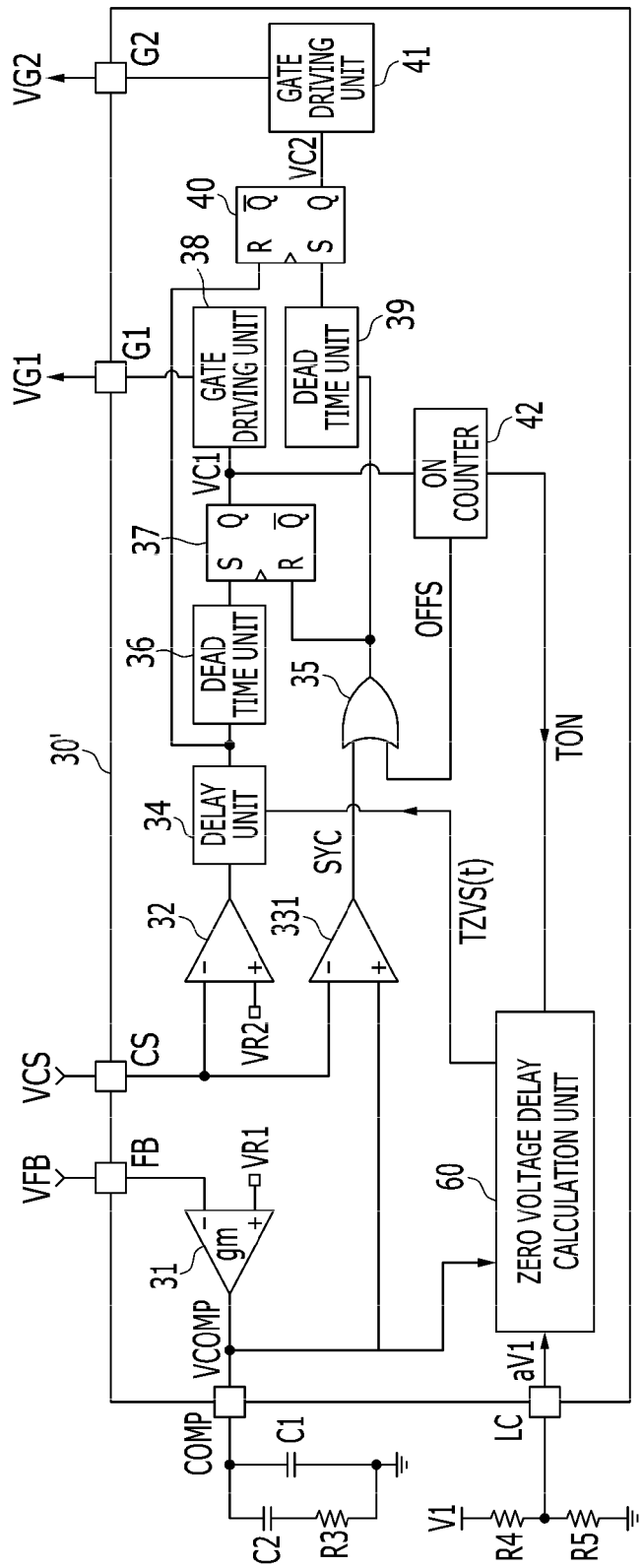
FIG. 7 is a diagram showing a switch control circuit including a zero voltage delay calculation unit according to still another embodiment.

FIG. 7 is a diagram showing a switch control circuit including a zero voltage delay calculation unit according to still another embodiment.

In a switch control circuit 30' according to still another embodiment, the same reference numerals are used for the same elements as those of the switch control circuit 30 according to the above-described embodiment, and detailed descriptions thereof will be omitted.

The switch control circuit 30' includes a comparator 331, instead of the synchronization control unit 33 of the switch control circuit 30. The comparator 331 generates a synchronization signal SYC according to a result of comparison between the comparison voltage VCOMP and the detection voltage VCS. The detection voltage VCS is input to an inverting terminal (−) of the comparator 331. The comparison voltage VCOMP is input to a non-inverting terminal (+) of the comparator 331. The comparator 331 outputs a high level when the input of the non-inverting terminal (+) is equal to or greater than the input of the inverting terminal (−). Otherwise, the comparator 331 outputs a low level.

As described above with reference to FIGS. 3 and 4, a rising slope of the inductor L is (VIN*sin ωt−VO)/L, and the inductor current IL may reach the peak current IPK as the inductor current IL increases with the slope during the ON time Ton(t). This is expressed as Equation 4 below.

$$\frac{VIN\sin\omega t - VO}{L} * Ton(t) = IPK. \qquad \text{[Equation 4]}$$

The following Equation 5 is obtained by rearranging Equation 4 with respect to the input voltage Vin.

$$VIN\sin\omega t = \frac{L \cdot IPK}{Ton(t)} + VO. \quad \text{[Equation 5]}$$

In addition, a relationship between the comparison voltage VCOMP and the peak current IPK is expressed as Equation 6.

$$aV1 = VCOMP = IPK \cdot \frac{L}{VO}. \quad \text{[Equation 6]}$$

The term aV1 is a proportional constant when the comparison voltage VCOMP is expressed using the peak current IPK, the inductance of the inductor L, and the output voltage VO. Information regarding the proportional constant may be set in the switch control circuit 30'.

Alternatively, the proportional constant aV1 may be set from the outside. As shown in FIG. 7, the switch control circuit 30' further includes a compensation pin LC, and the compensation pin LC is connected to a node to which a resistor R4 and a resistor R5 are connected. Since the resistor R4 and the resistor R5 are connected in series between the voltage V1 and the ground, the proportional constant aV1 may be set from the outside of the switch control circuit 30' by adjusting a resistance ratio a (=R5/(R4+R5)).

The following Equation 7 is obtained by substituting Equation 5 to Equation 2 and rearranging Equation 2 with respect to the zero voltage delay time TZVS(t) using Equation 6.

$$TZVS(t) = aV1 \cdot VCOMP \cdot \frac{Td}{Ton(t)} + Td. \quad \text{[Equation 7]}$$

On the basis of Equation 7, a zero voltage delay calculation unit 60 according to still another embodiment receives the comparison voltage VCOMP, the proportional constant aV1, and the ON count signal TON, multiplies the comparison voltage VCOMP, the proportional constant aV1, and the delay time Td, divides the product by the ON time Ton(t) that is based on the ON count signal TON, and adds the delay time Td to the quotient to calculate the zero voltage delay time TZVS(t).

Since Equation 7 does not need information regarding the OFF time, the switch control circuit 30' does not include an OFF counter.

Figure 8:
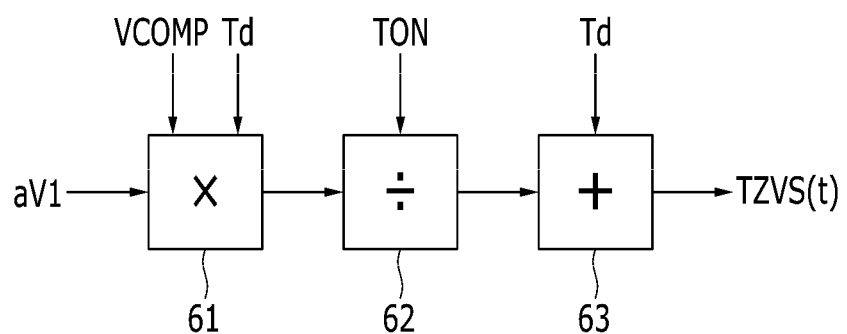
FIG. 8 is a diagram showing a zero voltage delay calculation unit according to still another embodiment.

FIG. 8 is a diagram showing a zero voltage delay calculation unit according to still another embodiment.

As shown in FIG. 8, the zero voltage delay calculation unit 60 includes a multiplier 61, a divider 62, and an adder 63.

The multiplier 61 outputs a result of multiplying the proportional constant aV1, the comparison voltage VCOMP, and the delay time Td. The proportional constant aV1 is indicated with the voltage of the compensation pin LC. The multiplier 61 may convert the voltage of the compensation pin LC into a digital signal. In addition, the multiplier 61 also converts the comparison voltage VCOMP into a digital signal. The delay time Td may be indicated with a digital signal stored in the zero voltage delay calculation unit 60. Accordingly, the multiplier 61 includes a digital circuit and may perform a multiplication operation between digital signals.

The divider 62 outputs a result of dividing an output of the multiplier 61 by the ON time Ton(t) that is based on the ON count signal TON. The adder 63 adds the delay time Td to an output of the divider 62 to calculate the zero voltage delay time TZVS(t). The divider 62 and the adder 63 may be implemented as digital circuits.

In the voltage mode control, the comparison voltage VCOMP does not include the information regarding the peak current IPK. In the voltage mode control, the switch control circuit may obtain the information regarding the peak current IPK by sampling/holding a peak of the detection voltage VCS.

In the voltage mode control, the zero voltage delay calculation unit according to still another embodiment may acquire the information regarding the peak current IPK through the detection voltage VCS to calculate the zero voltage delay time TZVS(t).

Figure 9:
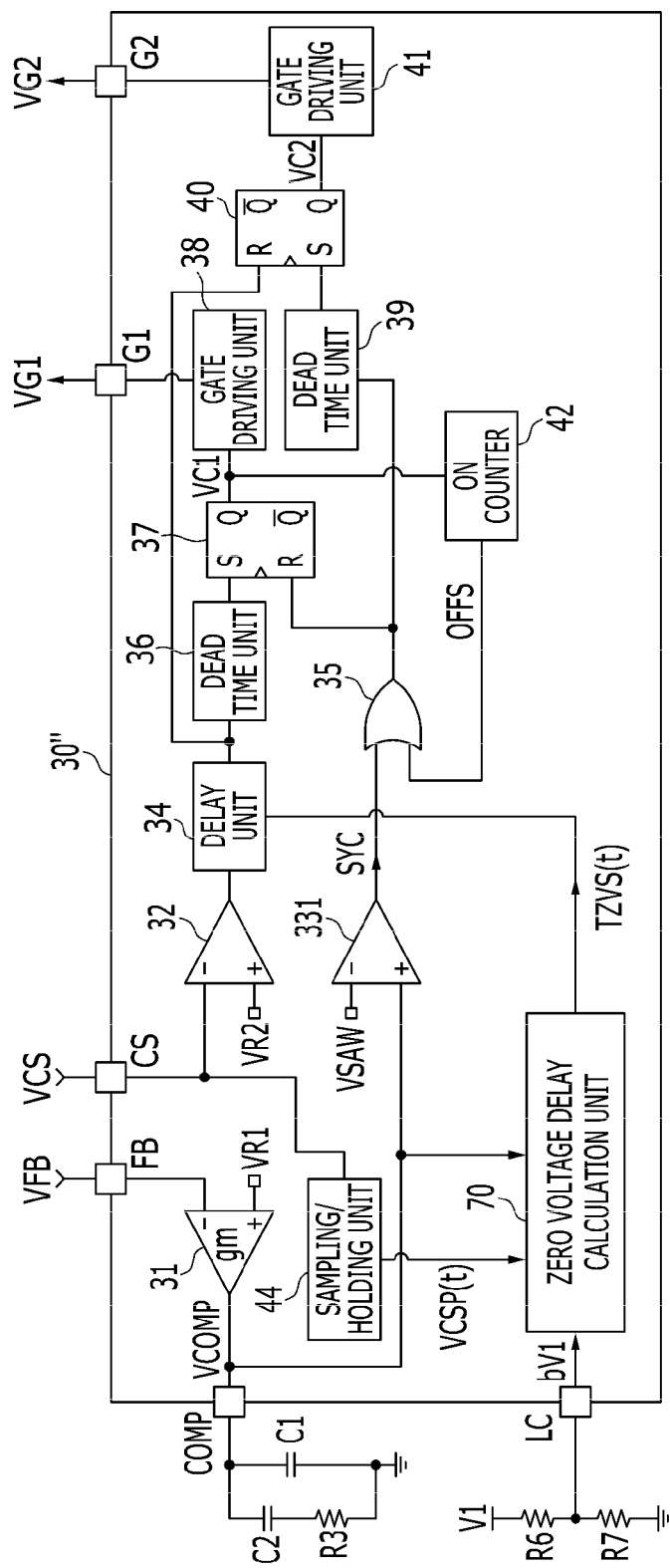
FIG. 9 is a diagram showing a switch control circuit including a zero voltage delay calculation unit according to still another embodiment.

FIG. 9 is a diagram showing a switch control circuit including a zero voltage delay calculation unit according to still another embodiment.

In a switch control circuit 30" according to still another embodiment, the same reference numerals are used for the same elements as those of the switch control circuits 30 and 30' according to the above-described embodiments, and detailed descriptions thereof will be omitted.

The switch control circuit 30" further includes a sampling/holding unit 44, and the sampling/holding unit 44 samples and holds the peak of the detection voltage VCS to generate a detection voltage peak VCSP(t).

As shown in FIG. 4, in the voltage mode control, the peak current IPK is not constant and varies according to the input voltage Vin. In the voltage mode control, since the ON time Ton of the power switch Q1 is controlled to be constant, and the inductor current IL increases with the slope according to the input voltage Vin, the peak current IPK and the detection voltage peak VCSP(t) corresponding to the peak current IPK change with time. A relationship between the peak current IPK and the peak of the detection voltage VCS is expressed as Equation 8.

$$bV1 \cdot VCSP(t) = IPK(t) \cdot \frac{L}{VO}. \quad \text{[Equation 8]}$$

The term bV1 is a proportional constant when the detection voltage peak VCSP(t) is expressed using the peak current IPK(t), the inductance of the inductor L, and the output voltage VO. According to still another embodiment, the proportional constant bV1 may be set from the outside. As shown in FIG. 9, the switch control circuit 30" further includes a compensation pin LC, and the compensation pin LC is connected to a node to which a resistor R6 and a resistor R7 are connected. Since the resistor R6 and the resistor R7 are connected in series between the voltage V1 and the ground, the proportional constant bV1 may be set from the outside of the switch control circuit 30" by adjusting a resistance ratio b (=R7/(R6+R7)).

The following Equation 9 is obtained by substituting Equation 5 to Equation 2 and rearranging Equation 2 using Equation 8 with respect to the zero voltage delay time TZVS(t).

$$TZVS(t) = bV1 \cdot VCSP(t) \cdot \frac{Td}{Ton} + Td. \qquad \text{[Equation 9]}$$

Here, since the ON time Ton is determined according to the comparison voltage VCOMP, Equation 9 may use the comparison voltage VCOMP instead of the ON time Ton. For example, a time at which a saw-tooth wave VSAW that determines a switching frequency of the power switch Q1 starts to increase and reaches the comparison voltage VCOMP is determined as the ON time Ton. That is, when an rising slope of the saw-tooth wave VSAW is 'c,' Ton*c=VCOMP. The following Equation 10 is obtained by substituting this to Equation 9.

$$TZVS(t) = bV1 \cdot VCSP(t) \cdot c \frac{Td}{VCOMP} + Td. \qquad \text{[Equation 10]}$$

A zero voltage delay calculation unit 70 does not receive a result of counting the ON time Ton from the ON counter 42 and uses the comparison voltage VCOMP. It would be appreciated that the zero voltage delay calculation unit 70 may also use the result of counting the ON time Ton.

On the basis of Equation 10, the zero voltage delay calculation unit 70 according to still another embodiment receives the comparison voltage VCOMP, the proportional constant bV1, and the detection voltage peak VCSP(t), multiplies the proportional constant bV1, the detection voltage peak VCSP(t), and the delay time Td, divides the product by the comparison voltage VCOMP, and adds the delay time Td to the quotient to calculate the zero voltage delay time TZVS(t).

It would be appreciated that, on the basis of Equation 9, the zero voltage delay calculation unit 70 may multiply the proportional constant bV1, the detection voltage peak VCSP(t), and the delay time Td, divide the product by the ON time Ton, and add the delay time Td to the quotient to calculate the zero voltage delay time TZVS(t).

Figure 10:
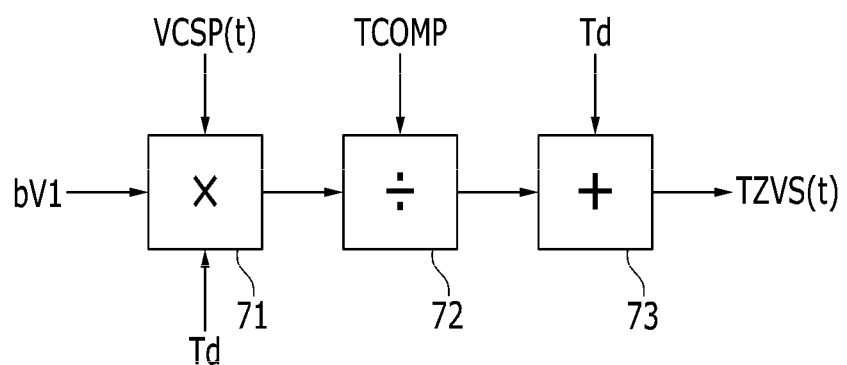
FIG. 10 is a diagram showing a configuration of a zero voltage delay calculation unit according to still another embodiment.

FIG. 10 is a diagram showing a configuration of a zero voltage delay calculation unit according to still another embodiment.

As shown in FIG. 10, the zero voltage delay calculation unit 70 includes a multiplier 71, a divider 72, and an adder 73.

The multiplier 71 outputs a result of multiplying the proportional constant bV1, the detection voltage peak VCSP(t), and the delay time Td. The proportional constant bV1 is indicated with the voltage of the compensation pin LC. The multiplier 71 may convert the voltage of the compensation pin LC into a digital signal. In addition, the multiplier 71 also converts the detection voltage peak VCSP(t) into a digital signal. The delay time Td may be indicated with a digital signal stored in the zero voltage delay calculation unit 70. Accordingly, the multiplier 71 includes a digital circuit and may perform a multiplication operation between digital signals.

The divider 72 outputs a result of dividing an output of the multiplier 71 by a digital signal that is based on the comparison voltage VCOMP. The adder 73 adds the delay time Td to an output of the divider 72 to calculate the zero voltage delay time TZVS(t). The divider 72 and the adder 73 may be implemented as digital circuits.

Although the exemplary embodiments of the present invention have been described in detail, the scope of the present invention is not limited thereto, but modifications and alterations made by those skilled in the art using the basic concept of the present invention defined in the following claims fall within the scope of the present invention.

What is claimed is:

1. A switch control circuit for a power switch and a synchronous switch that are connected to an inductor, the switch control circuit comprising:
   a comparator configured to compare a detection voltage obtained by detecting an inductor current flowing through the inductor with a predetermined reference voltage;
   a delay unit configured to delay an output of the comparator by a zero voltage delay time; and
   a zero voltage delay calculation unit configured to calculate the zero voltage delay time based on an ON time and an OFF time of the power switch and a delay time,
   wherein the delay time is determined based on the inductor and parasitic capacitors of the power switch and the synchronous switch, and
   wherein the zero voltage delay calculation unit is further configured to calculate a difference between a first zero voltage delay time calculated for a first previous switching period of the power switch and a second zero voltage delay time calculated for a second previous switching period of the power switch and to compensate for a zero voltage delay time of a current switching period of the power switch using the calculated difference.

2. The switch control circuit of claim 1, wherein the zero voltage delay calculation unit is further configured to calculate the zero voltage delay time by adding the ON time and the OFF time in the current switching period of the power switch, dividing the sum by the ON time in the current switching period, multiplying the quotient by the delay time, and adding the calculated difference to the product.

3. The switch control circuit of claim 1, wherein the OFF time of the power switch is an OFF time of the power switch in an immediately previous switching period.

4. A buck converter comprising:
   a power switch having one end to receive an input voltage;
   a synchronous switch connected between a second end of the power switch and ground;
   an inductor having an end connected to the second end of the power switch; and
   a switch control circuit configured to calculate a zero voltage delay time based on an ON time and an OFF time of the power switch and a delay time,
   wherein the delay time is determined based on the inductor and parasitic capacitors of the power switch and the synchronous switch,
   wherein the switch control circuit is further configured to calculate a difference between a first zero voltage delay time calculated for a first previous switching period of the power switch and a second zero voltage delay time calculated for a second previous switching period of the power switch and compensate for a zero voltage delay time of a current switching period of the power switch using the calculated difference.

5. A switch control circuit for a power switch and a synchronous switch that are connected to an inductor, the switch control circuit comprising:
   a comparator configured to compare a detection voltage obtained by detecting an inductor current flowing through the inductor with a predetermined reference voltage;

a delay unit configured to delay an output of the comparator by a zero voltage delay time; and a zero voltage delay calculation unit configured to calculate the zero voltage delay time based on an ON time and an OFF time of the power switch and a delay time, wherein the delay time is determined based on the inductor and parasitic capacitors of the power switch and the synchronous switch, and wherein the zero voltage delay calculation unit is further configured to calculate the zero voltage delay time based on a result of adding the ON time and the OFF time of the power switch, dividing the sum by the ON time, and multiplying the quotient by the delay time.

6. The switch control circuit of claim 5, wherein the OFF time of the power switch is an OFF time of the power switch in an immediately previous switching period.

7. The switch control circuit of claim 6, wherein the zero voltage delay calculation unit is further configured to calculate a difference between a first zero voltage delay time calculated for a first previous switching period of the power switch and a second zero voltage delay time calculated for a second previous switching period of the power switch and compensate for a zero voltage delay time of a current switching period of the power switch using the calculated difference.

* * * * *